(12) United States Patent
Lee

(10) Patent No.: US 8,809,840 B2
(45) Date of Patent: Aug. 19, 2014

(54) ORGANIC LIGHT EMITTING DEVICE

(75) Inventor: Sung-Soo Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 140 days.

(21) Appl. No.: 13/137,469

(22) Filed: Aug. 18, 2011

(65) Prior Publication Data

US 2012/0267610 A1   Oct. 25, 2012

(30) Foreign Application Priority Data

Apr. 20, 2011   (KR) .................. 10-2011-0036860

(51) Int. Cl.
*H01L 29/08*   (2006.01)

(52) U.S. Cl.
USPC   257/40; 257/759; 257/E39.007; 257/E51.001

(58) Field of Classification Search
USPC ................ 257/40, 759, E39.007, E51.001
See application file for complete search history.

(56) References Cited

U.S. PATENT DOCUMENTS

2003/0122481 A1 *   7/2003   Song et al. ............. 313/506

FOREIGN PATENT DOCUMENTS

| JP | 2004-079421 A | 3/2004 |
| KR | 10-2007-0019495 A | 2/2007 |
| KR | 10-2008-0083881 A | 9/2008 |
| KR | 10-2009-0039065 A | 4/2009 |

* cited by examiner

*Primary Examiner* — Dale E Page
(74) *Attorney, Agent, or Firm* — Lee & Morse, P.C.

(57) ABSTRACT

An organic light emitting device may include an emission layer between a reflecting electrode and one of a transmitting or transflective electrode, and an optical control layer formed with an organic material that is 5000 to 10,000 Å thick between the transmitting or transflective electrode and the emission layer.

9 Claims, 5 Drawing Sheets

ORGANIC LIGHT EMITTING DEVICE

RELATED APPLICATIONS

This application claims priority to and the benefit of Korean Patent Application No. 10-2011-0036860 filed in the Korean Intellectual Property Office on Apr. 20, 2011, the entire contents of which are incorporated herein by reference.

BACKGROUND

1. Field

Embodiments relate to an organic light emitting device.

2. Description of the Related Art

An organic light emitting device (OLED) is a display device for generating an image. The image is generated by combining holes and electrons in an organic emission layer formed between an anode and a cathode, and emitting light. The holes are supplied by the anode, and the electrons are supplied by the cathode. The organic light emitting device has excellent display characteristics, i.e., a wide viewing angle, a fast response speed, a slim body, a low production cost, and a high contrast.

The information in the Background is only for enhancing an understanding of the described technology. Therefore, it may contain information that does not form the prior art already known to a person of ordinary skill in the art in this country.

SUMMARY

Embodiments may be directed to an organic light emitting device.

An exemplary embodiment may be an organic light emitting device including an emission layer between a reflecting electrode and one of a transmitting or transflective electrode, and an optical control layer formed with an organic material that is 5000 to 10,000 Å thick between the transmitting or transflective electrode and the emission layer The optical control layer is formed with a material to which current and voltage are applied.

The organic light emitting device is 7000 to 12,000 Å thick.

The emission layer is a white emission layer including green, blue, and red emission layers.

The white emission layer generates constructive interference of 4 to 7 times within a wavelength area of visible light.

The white emission layer generates constructive interference of 4 times within the wavelength area of the visible light.

The optical control layer includes at least one of a hole injection layer and a hole transport layer.

The transmitting or transflective electrode is an anode, and the reflecting electrode is a cathode.

Another embodiment may be an organic light emitting device including an emission layer between a reflecting electrode and one of a transmitting or transflective electrode, and an optical control layer with a predetermined thickness such that light sources generated from the emission layer impart constructive interference of 4 to 7 times within a wavelength area of visible light between the transmitting or transflective electrode and the emission layer.

The optical control layer is 5000 to 10,000 Å thick.

The optical control layer is formed with an organic material having a refractive index of 1.4 to 2.5.

The optical control layer is formed with a material to which current and voltage are applied.

The organic light emitting device is 7000 to 12,000 Å thick.

The emission layer is a white emission layer including green, blue, and red emission layers.

The white emission layer generates constructive interference of 4 times within a wavelength area of the visible light.

The optical control layer includes at least one of a hole injection layer and a hole transport layer.

The transmitting or transflective electrode is an anode, and the reflecting electrode is a cathode.

DETAILED DESCRIPTION

Example embodiments will now be described more fully hereinafter with reference to the accompanying drawings; however, they may be embodied in different forms and should not be construed as limited to the embodiments set forth herein.

Figure 1:
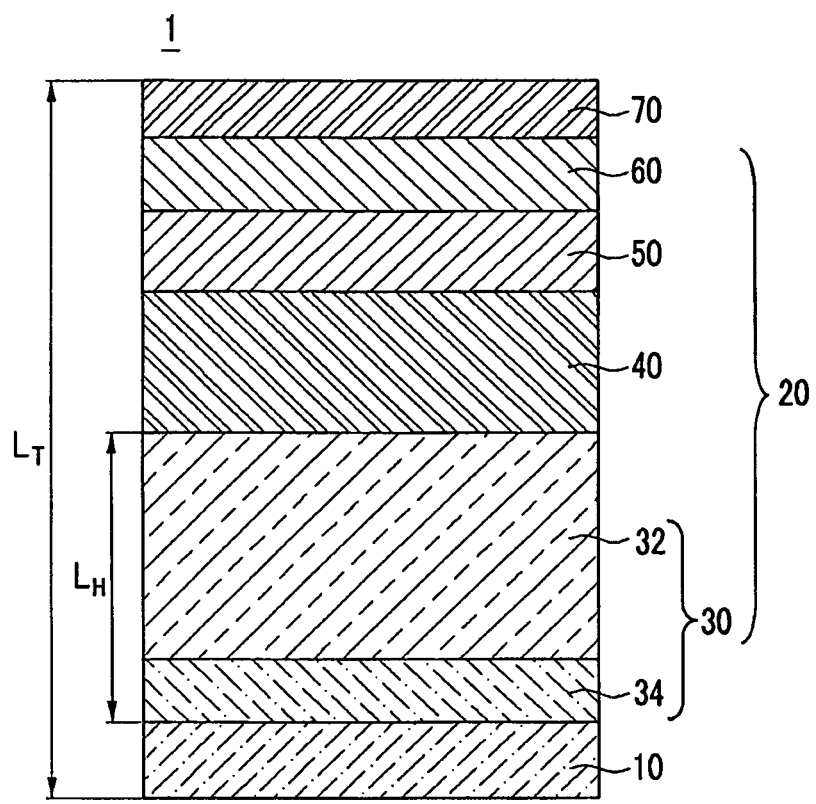
FIG. 1 shows a cross-sectional view of an organic light emitting device according to an exemplary embodiment.

FIG. 1 shows a cross-sectional view of an organic light emitting device 1 according to an exemplary embodiment.

Referring to FIG. 1, the organic light emitting device 1 includes a transmitting electrode 10, a reflecting electrode 70, an optical control layer 30, and an emission layer 40.

The organic light emitting device 1 can be provided on a substrate (not shown) and be operable by a bottom emission method for outputting light to the bottom of the substrate.

For example, the substrate can be a glass substrate or a transparent plastic substrate with excellent mechanical strength, thermal stability, transparency, surface smoothness, ease of handling, and water-resistance. In this instance, a thin film transistor (TFT) can be provided on the substrate to control the organic light emitting device 1.

A transmitting electrode 10 is disposed on the substrate. The transmitting electrode 10 is formed to be an anode. In this instance, a transflective electrode generated by coating a thin metal can be used other than the transmitting electrode 10.

The anode is formed on the substrate by depositing or sputtering an electrode material with a high work function. The anode is desirably formed with a transparent material.

In this instance, the anode material uses a transparent material with excellent conductivity such as indium tin oxide (ITO), indium zinc oxide (IZO), tin oxide ($SnO_2$), and zinc oxide (ZnO).

The organic light emitting device 1 includes a reflecting electrode 70 to correspond to the transmitting electrode 10 formed to be the anode.

The reflecting electrode 70 is provided on an upper part of an organic layer 20. According to the present exemplary embodiment, the transmitting electrode 10 is an anode so the reflecting electrode 70 is formed to be a cathode.

The reflecting electrode 70 is formed by sequentially stacking a reflective plate and the ITO or IZO, a transparent electrode material, or it can be a metal electrode in a single layer or multiple layers formed by at least one of aluminum (Al), silver (Ag), nickel (Ni), platinum (Pt), gold (Au), iridium (Ir), chromium (Cr), and their oxides. In this instance, it is desirable to form the reflective plate with aluminum-neodymium (Al—Nd).

The reflective plate, the transparent electrode, or the metal electrode of the reflecting electrode 70 is formed by the conventional sputtering or vacuum depositing method, and is formed to be 800-1200 Å thick to function as a reflecting electrode.

The organic light emitting device 1 includes an organic layer 20 for transferring charges between the transmitting electrode 10 and the reflecting electrode 70.

In further detail, the organic layer 20 includes at least hole injection layer (HIL) 32, a hole transport layer (HTL) 34, an emission layer (EML) 40, a hole blocking layer (HBL), an electron transport layer (ETL) 50, and an electron injection layer (EIL) 60.

In this instance, low molecules such as CuPc, TNATA, TCTA, d TDAPB and high molecules such as PANI and PEDOT are usable for the hole injection layer (HIL) 32.

Further, the hole transport layer (HTL) 34 uses low molecules such as NPB, TPD, s-TAD, MTADATA including arylamine low molecules, hydrazone low molecules, stilbene low molecules, starburst low molecules and high molecules such as PVK including carbazole high molecules, arylamine high molecules, perylenes, and pyrrole high molecules.

Also, the low molecules such as Alq3 (tris (8-quinolinol) aluminum), BCP, CF-X, TAZ, or spiro-TAZ are used for the hole blocking layer (not shown).

In addition, an inorganic matter such as LiF or Ca, a quinolinol derivative metal complex such as Alq3, an oxadiazole derivative, and a triazole derivative can be used for the electron transport layer (ETL) 50.

Further, a low molecular material such as Alq3, a gallium (Ga) complex, or PBD, or an oxadiazole-based high molecular material, can be used for the electron injection layer (EIL) 60.

In this instance, the organic light emitting device 1 can be configured by a conventional material and method of the field in the materials of the respective layers configuring the organic layer 20 and the manufacturing method thereof. The stacking structure of the organic layer 20 is one example, but present embodiments are not limited thereto.

In the organic light emitting device 1, the emission layer 40 can be a white emission layer. In this instance, the emission layer 40 can be formed with two complementary color emission layers (not shown) or three primary color (green, blue, red) emission layers. In order to realize various colors by using a color filter, it is desirable for the emission layer 40 to include a green, blue, and red emission layers.

The emission layer 40 can be formed by using a fluorescent or phosphorescent light emitting material for a host material as a dopant.

In this instance, the same host material used for the emission layer 40 can be used for the blue, red, and green emission layers. The host material of the green and red emission layers can be different from the host material used for the blue emission layer.

The host material used for the low molecular organic light emitting device is used without limits, i.e., ADN, TBADN, or Alq$_3$.

When the organic light emitting device is manufactured, no special device or method is needed. The OLED can be manufactured according to the method for manufacturing the organic light emitting device using a general light emitting material.

The organic light emitting device includes an optical control layer 30.

In detail, the optical control layer 30 of the organic light emitting device 1 is provided between the transmitting electrode 10 of the organic light emitting device 1 and the emission layer 40.

In this instance, the optical control layer 30 can be formed with an organic material that is 5000 to 11,000 Å thick. The optical control layer 30 is configured with at least one of the hole injection layer (HIL) 32 and the hole transport layer (HTL) 34. In the present exemplary embodiment, the hole injection layer (HIL) 32 and the hole transport layer (HTL) 34 form the optical control layer 30.

Therefore, the sum of thickness of the hole injection layer (HIL) 32 and the hole transport layer (HTL) 34 can be 5000 to 10,000 Å.

Accordingly, when the optical control layer 30 provided between the emission layer 40 and the transmitting electrode 10 is 5000 to 10,000 Å thick, the whole thickness of the organic light emitting device 1 can be 7000 to 12,000 Å.

A current and a voltage can be applied to the optical control layer 30 of the organic light emitting device 1.

Multiple resonances occur in the organic light emitting device and the white light formed by the emission layer generate constructive interference within a wavelength of the visible light when the thickness of the organic material layer between the transmitting electrode and the emission layer becomes substantially greater than the thickness of the entire organic light emitting device by substantially increasing the thickness of the organic material layer between the transmitting electrode of the organic light emitting device and the emission layer as a method for improving the viewing angle of the organic light emitting device.

In this instance, it depends on the color. For example, the optical thickness L of the organic light emitting device has to satisfy Equation 1 so as to satisfy the conditions of constructive interference and multiple resonances while white is maintained.

$$m\lambda = 2\,nL + \Phi \quad \text{[Equation 1]}$$

Herein, $\lambda$=a position of an EL main peak of RGB, red is 620 nm, green is 530 nm, and blue is 460 nm, n=a refractive index of an organic material (it is variable by a material and a wavelength), L=a length to be optimized, and $\Phi$=a phase change that is changed by the reflecting electrode and RGB. When Al is used as a reflecting electrode, it is give that $\Phi$_red is 160 nm, $\Phi$_green is 150 nm, and $\Phi$_blue is 140 nm.

Also, for the purpose of constructive interference, a distance (Z) between the emission layer and the reflecting electrode must be optimized, and the distance Z must satisfy Equation 2.

$$Z = L/2 - 10\,\text{nm} \quad \text{[Equation 2]}$$

It is therefore possible to manufacture the white organic light emitting device satisfying L and Z and simultaneously satisfying the electrical characteristics.

When the white organic light emitting device is manufactured as described above, a white organic light emitting device that is 1000-3,000 Å thick is generated, which constructively interferes once or twice in the visible light area.

Figure 2:
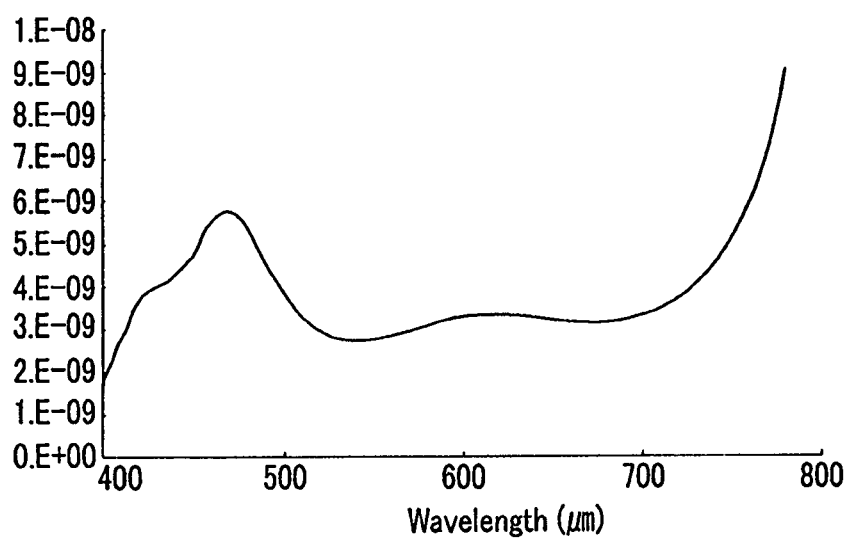
FIG. 2 shows a transmitting spectrum graph according to a conventional organic light emitting device structure.

A resonance position where the white organic light emitting device with the thickness of 1000-3,000 Å constructively interferes is shown in FIG. 2.

As shown in FIG. 2, the white organic light emitting device with the thickness of 1000-3,000 Å has a resonance position (i.e., the constructive interference occurs at the position of 450 µm).

In comparison, the organic light emitting device according to the exemplary embodiment increases the number of resonance positions where constructive interference occurs from 1 or 2 to 4 to 7 by making a specific organic material layer in the organic light emitting device thick so the white light spectrum generated with respect to the initial vertical angle (0 degrees) may be less transformed than the conventional one with respect to a predetermined slanted angle.

For this purpose, regarding the organic light emitting device for bottom emission according to the exemplary embodiment, as can be known from FIG. 1, the thickness of the organic material layer between the transmitting electrode 10 a lower electrode and the emission layer 40 that is the nearest transmitting electrode 10, that is, the optical control layer 30 including the hole transport layer (HTL) 34 and the hole injection layer (HIL) 32, is formed to be substantially thicker than the conventional organic light emitting device.

In present embodiments, it is desirable for the constructive interference to occur 4 to 7 times in the visible light area so that the organic light emitting device may maintain the light viewing angle effect.

When this fact is applied to Equation 1, Equation 3 is obtained.

$$L = m\lambda/2\,n \quad \text{[Equation 3]}$$

In this instance, it is desirable for the organic light emitting device to have the thickness ($L_T$) that is greater than 7000 Å in order to generate constructive interference of at least 4 times (m=4) for the R, G, B. Further, it is desirable for the organic light emitting device to have the thickness ($L_T$) that is less than 12,000 Å in order to generate constructive interference that is no more than 7 times for the R, G, B.

Therefore, in the exemplary embodiment, it is desirable to form the organic material layer between the transmitting electrode used as an optical control layer and the emission layer that is the nearest the transmitting electrode to have the thickness ($L_H$) that is greater than 5000 Å and is less than 10,000 Å.

The above-noted condition is variable by the refractive index of the organic material layer. In the present exemplary embodiment, the thickness of the organic material layer is calculated by setting the refractive index of the generally-used organic material layer to be 1.4 to 2.5.

Figure 3:
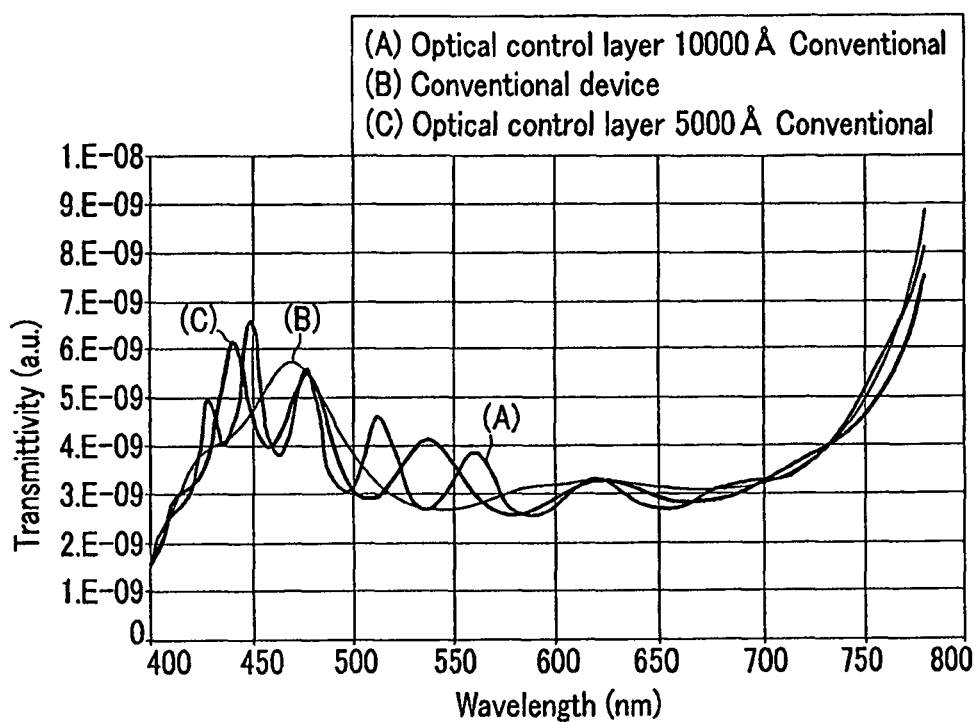
FIG. 3 shows a transmitting spectrum graph following an organic light emitting device for showing a number of constructive interference when a thickness of an optical control layer is 10,000 Å (Case A), when it is 5000 Å (Case B), and when it includes an organic layer with a general thickness (Case C).

Regarding the organic light emitting device calculated by the above-described method, a transmitting spectrum graph according to the organic light emitting device showing constructive interference in the case (A) in which the optical control layer is 10,000 Å thick, the case (C) in which the optical control layer is 5000 Å thick, and the case (B) of a general thickness (For example, less than 3000 Å thick) of the organic layer is shown in FIG. 3. The position where a vertex in the respective graph waves of FIG. 3 indicates the position where the constructive interference has occurred.

As can be known from FIG. 3, regarding the organic light emitting device 1, the constructive interference occurs at various wavelengths of the visible light area. In detail, constructive interference occurs seven times when the optical control layer is 10,000 Å thick and it occurs four times when the optical control layer is 5000 Å thick.

Therefore, the organic light emitting device 1 generates constructive interference at various wavelengths when the light is output through a predetermined viewing angle so it controls the change of spectrum and thereby controls the color change caused by the viewing angle.

Figure 4:
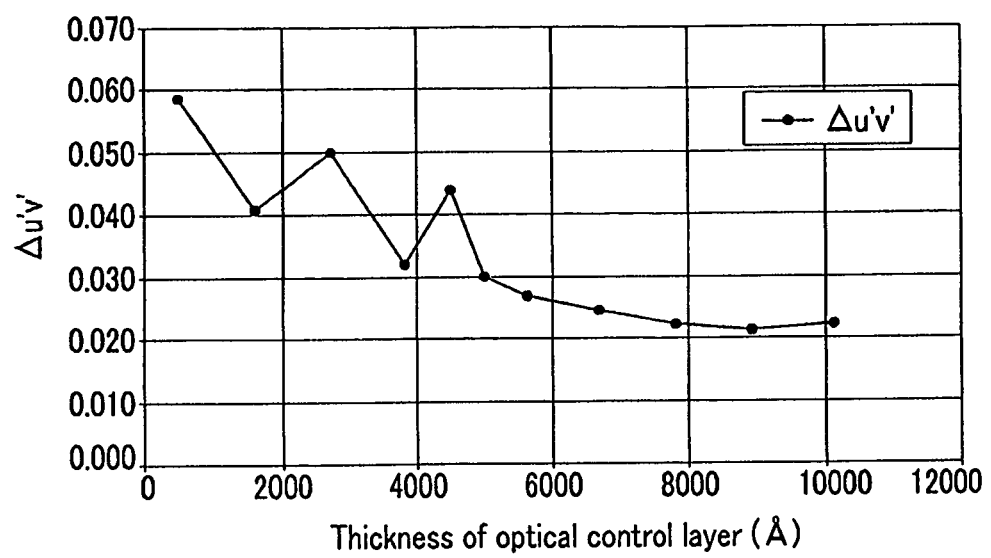
FIG. 4 shows a graph of a color change characteristic depending on a thickness of an optical control layer.

FIG. 4 shows a graph of a color change characteristic depending on a thickness of an optical control layer. Table 1 shows the values of Δu'v' according to thickness of the optical control layer shown in the graph of FIG. 4.

TABLE 1

| Thickness of optical control layer | Δu'v' |
| --- | --- |
| 500 | 0.059 |
| 1600 | 0.041 |
| 2700 | 0.050 |
| 3800 | 0.032 |
| 4500 | 0.044 |
| 5000 | 0.030 |
| 5600 | 0.027 |
| 6700 | 0.025 |
| 7800 | 0.022 |
| 8900 | 0.021 |
| 10100 | 0.022 |

Referring to FIG. 4 and Table 1, the value of Δu'v' is irregularly decreased when the thickness of the optical control layer is increased in the range in which the thickness is less than 5000 Å, and the value of Δu'v' belongs to the range of 0.020-0.030 when the thickness is 5000 to 10,000 Å.

Figure 5:
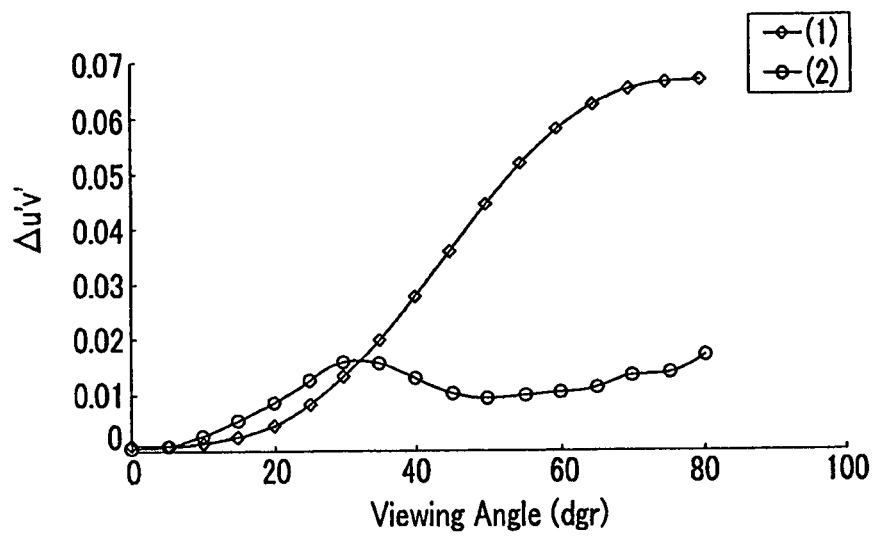
FIG. 5 shows a graph for comparing viewing angles of a conventional organic light emitting device and an organic light emitting device according to an exemplary embodiment.

FIG. 5 shows a graph for comparing the viewing angle (B) of the organic light emitting device according to the exemplary embodiment and the viewing angle (A) of the general organic light emitting device by using the change of the spectrum following the wavelength range shown in FIG. 2 and FIG. 3.

As can be checked from FIG. 5, when compared with the viewing angle A of the conventional organic light emitting device, the viewing angle (B) of the device according to the exemplary embodiment has a fourth level of the viewing angle characteristic with reference to 80 degrees so the color change caused by the viewing angle is substantially reduced.

By way of summation and review, an organic light emitting device is manufactured with an anode, a multi-layered EL structure, a cathode, and the OLED generates light.

The organic light emitting device is classified into a bottom emission type and a top emission type according to the emitting direction of the light generated by the organic emission layer. The top emission method provides a reflecting electrode to a lower part of the organic emission layer to allow the light to be output to an upper part of the thin film transistor. The bottom emission method allows the light to be output to the bottom where the thin film transistor (TFT) for driving the organic light emitting device is provided.

Regarding the bottom emission method, a transparent oxide film, i.e., ITO is used for the anode, and the light generated by the emission layer inside the EL structure is directly output to the anode or is reflected on the cathode and then output to the anode.

In this instance, the light is output to the outside at various angles, constructive or destructive interference is generated according to the light output path, and the light is changed to red, green, and blue (RGB) to be different from the color that is generated.

In the case of the white light emitting structure for vertically stacking the RGB, white light having a wide wavelength range is generated so the color change caused by a light emission angle becomes more sensitive. To supplement the color change caused by the viewing angle, an emission layer (EML) is patterned for respective red, green, and blue in the RGB side-by-side patterning method. The color change can be reduced by controlling the thickness of an organic material for each color. However, it is difficult to control the thickness for the red, green, and blue since the white light emitting method uses an open mask instead of fine patterning.

In addition to the above-noted method, the viewing angle can be controlled by forming various types of inorganic or oxide thin films next to the electrode that outputs light. However, forming various types of thin films makes the process more difficult and reduces the process window because the thickness of the inorganic film in the TFT structure is restricted. In addition, the TFT process is increased or a photo process is added to increase an error rate or production cost.

In contrast, embodiments may be directed to an organic light emitting device with a wide viewing angle. More particularly, embodiments relate to an organic light emitting device having a wide color gamut and less color change at a wide viewing angle. Embodiments may also be directed to an organic light emitting device for controlling a color change following a viewing angle change.

According to exemplary embodiments, constructive interference occurs at various wavelengths in the organic light emitting device to control the change of spectrum when light is output through a predetermined viewing angle. Thus, the predetermined viewing angle may control the color change.

Exemplary embodiments have been disclosed herein, and although specific terms are employed, they are used and are to be interpreted in a generic and descriptive sense only and not for purpose of limitation.

What is claimed is:

1. An organic light emitting device, comprising:
    an emission layer between a reflecting electrode and one of a transmitting or transflective electrode, and
    an optical control layer formed with an organic material that is 5000 to 10,000 Å thick between the transmitting or transflective electrode and the emission layer, wherein:
    the organic light emitting device is 7000 to 12,000 Å thick, and
    the emission layer generates constructive interference such that 4 to 7 peaks occur within a wavelength area of visible light.

2. The organic light emitting device as claimed in claim 1, wherein the optical control layer is formed with a material to which current and voltage are applied.

3. The organic light emitting device as claimed in claim 1, wherein the emission layer is a white emission layer including green, blue, and red emission layers.

4. The organic light emitting device as claimed in claim 3, wherein the white emission layer generates constructive interference such that 4 to 7 peaks occur within a wavelength area of visible light.

5. The organic light emitting device as claimed in claim 4, wherein the white emission layer generates constructive interference such that 4 peaks occur within the wavelength area of the visible light.

6. The organic light emitting device as claimed in claim 1, wherein the optical control layer includes at least one of a hole injection layer and a hole transport layer.

7. The organic light emitting device as claimed in claim 1, wherein the transmitting or transflective electrode is an anode, and the reflecting electrode is a cathode.

8. The organic light emitting device as claimed in claim 1, wherein the optical control layer is formed with an organic material having a refractive index of 1.4 to 2.5.

9. The organic light emitting device as claimed in claim 1, wherein the thickness of the organic light emitting device is the overall thicknesses of the anode, the cathode, and each layer between the anode and cathode.

* * * * *